(12) United States Patent
Lahiri (10) Patent No.: US 9,559,708 B2
(45) Date of Patent: Jan. 31, 2017

(54) CHARGE PUMP CIRCUIT FOR A PHASE LOCKED LOOP

(71) Applicant: STMicroelectronics International N.V., Amsterdam (NL)

(72) Inventor: Abhirup Lahiri, Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 15/229,322

(22) Filed: Aug. 5, 2016

(65) Prior Publication Data

US 2016/0344395 A1    Nov. 24, 2016

Related U.S. Application Data

(63) Continuation of application No. 14/718,597, filed on May 21, 2015, now Pat. No. 9,438,254.

(51) Int. Cl.
*H03L 7/06* (2006.01)
*H03L 7/089* (2006.01)
*H03L 7/099* (2006.01)

(52) U.S. Cl.
CPC ............ *H03L 7/0891* (2013.01); *H03L 7/099* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 7,158,600 B2* | 1/2007 | Puccio | ................ | H03L 7/0895 327/148 |
| 7,944,376 B2* | 5/2011 | Jensen | ................ | H04L 27/368 327/157 |
| 2009/0261917 A1* | 10/2009 | Taghivand | ............ | H03L 1/025 331/36 C |
| 2010/0289541 A1* | 11/2010 | Wu | ...................... | H03L 7/0802 327/158 |
| 2011/0050302 A1* | 3/2011 | Yamaguchi | ......... | H03L 7/0896 327/157 |
| 2012/0249250 A1* | 10/2012 | Cheng | ................... | H03B 27/00 331/45 |
| 2013/0027100 A1* | 1/2013 | Yaghini | ................. | H03L 7/091 327/156 |
| 2013/0047911 A1 | 2/2013 | Rasmus | | |
| 2013/0049711 A1* | 2/2013 | Mirea | ................. | H02M 3/1563 323/234 |
| 2015/0162921 A1* | 6/2015 | Chen | .................... | H03L 7/0898 327/157 |
| 2015/0222280 A1* | 8/2015 | Allan | ..................... | H03L 7/083 327/157 |

(Continued)

*Primary Examiner* — Adam Houston
(74) *Attorney, Agent, or Firm* — Gardere Wynne Sewell, LLP (57) ABSTRACT

Disclosed herein is a circuit including a phase frequency detector (PFD) configured to compare phases of an input signal and a feedback signal, and to generate first and second control signals as a function of that comparison. An attenuation circuit includes a capacitor coupled in series between a node and a switching node, and is configured to charge the capacitor and disconnect the switching node from ground based on assertion of the first control signal, and discharge the capacitor and connect the switching node to ground based on assertion of the second control signal.

22 Claims, 7 Drawing Sheets

(56) References Cited

U.S. PATENT DOCUMENTS

| | | | |
|---|---|---|---|
| 2015/0229317 A1* | 8/2015 | Juneau | H03L 7/18 327/105 |
| 2016/0079991 A1* | 3/2016 | Pelissier | H03L 7/08 327/158 |
| 2016/0112053 A1* | 4/2016 | Perrott | H03L 7/093 327/156 |

* cited by examiner

CHARGE PUMP CIRCUIT FOR A PHASE LOCKED LOOP

RELATED APPLICATION

This application is a continuation of U.S. application Ser. No. 14/718,597, filed on May 21, 2015, entitled "CHARGE PUMP CIRCUIT FOR A PHASE LOCKED LOOP", the contents of which are hereby incorporated by reference in their entirety.

TECHNICAL FIELD

This disclosure is related to the field of phase locked loops, and, more particularly, to a charge pump circuit for phase locked loops.

BACKGROUND

A phase locked loop (PLL) is a control system that generates an output signal whose phase is related to the phase of an input signal. A typical phase locked loop includes a variable frequency oscillator and a phase detector. The oscillator generates a periodic signal. The phase detector compares the phase of the input signal with the phase of the periodic signal and generates control signals that adjust the oscillator to keep the phases matched.

Keeping the input and output phases locked also implies keeping the input and output frequencies the same. Consequently, in addition to synchronizing phases between signals, a phase locked loop can track an input frequency, or it can generate a frequency that is a multiple of the input frequency.

Such phase locked loops are widely employed in radio, telecommunications, computers and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can provide a complete phase locked loop building block, phase locked loops are widely used in modern electronic devices, with output frequencies from a fraction of a hertz up to many gigahertz.

In some cases, it may be desirable for a phase locked loop to be operable over a wide band of frequencies. In order to produce such wide band phase locked loops, a charge pump circuit is typically employed in the loop to generate the control signals sent to the oscillator. However, such charge pump circuits may be noisy, resulting in an undesirable amount of in-band noise.

Therefore, new phase locked loop designs with new charge pump circuits are desirable.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is a circuit including a phase frequency detector (PFD) configured to compare phases of an input signal and a feedback signal, and to generate first and second control signals as a function of that comparison. An attenuation circuit includes a capacitor coupled in series between a node and a switching node, and is configured to charge the capacitor and disconnect the switching node from ground based on assertion of the first control signal, and discharge the capacitor and connect the switching node to ground based on assertion of the second control signal.

A phase locked loop includes a phase frequency detector (PFD) configured to compare phases of an input signal and a feedback signal, and to generate therefrom control signals. A an attenuation circuit is coupled in series with the PFD and includes first and second current sources, and a loop filter coupled between a voltage controlled oscillator (VCO) control node and a ground node. An amplifier has an input coupled to the VCO control node. An impedance network is coupled to the VCO control node and includes at least one impedance element configured to be coupled to the first current source such that voltage at the VCO control node increases, based upon the control signals indicating that the phase of the input signal leads the phase of the feedback signal, and coupled to the second current source such that the voltage at the VCO control node decreases, based upon the control signals indicating that the phase of the feedback signal leads the phase of the input signal. A VCO is coupled to the VCO control node and to generate an output signal based upon a signal at the VCO control node, with the phase of the output signal matching the phase of the input signal. The feedback signal is based upon the output signal.

Another aspect is directed to a circuit including a first current source coupled between a power supply node and a first node, and a first switch coupled between the first node and a second node and controlled by a first control signal. A second switch is coupled between the second node and a third node and controlled by a second control signal. A second current source is coupled between the third node and a ground node. A third switch is coupled between the first node and an output node and controlled by a complement of the first control signal. A fourth switch is coupled between the second node and the output node and controlled by a third control signal. A fifth switch is coupled between the second node and a fourth node and controlled by the third control signal. A first capacitor coupled between the second node and the fourth node, and a second capacitor coupled between the second node and ground. A sixth switch is coupled between the fourth node and a fifth node and controlled by an inverse of the third control signal. A loop filter coupled between the fifth node and ground. An amplifier has a non-inverting terminal coupled to the fifth node, an inverting terminal coupled to the output node, and an output terminal coupled to the output node. A seventh switch coupled between the output node and the third node and controlled by an inverse of the second control signal.

A further aspect is directed to a circuit including a first current source coupled between a power supply node and a first node, and a first switch coupled between the first node and a second node and controlled by a first control signal. A second switch is coupled between the second node and a third node and is controlled by a second control signal. A second current source is coupled between the third node and a ground node. A first resistor is coupled between the second node and a fifth node. A second resistor is coupled between the second node and a fourth node. A third switch is coupled between the fourth node and a sixth node and controlled by a third control signal. A loop filter is coupled between the fifth node and ground. An amplifier has a non-inverting terminal coupled to the fifth node, an inverting terminal coupled to the sixth node, and an output terminal coupled to the sixth node.

DETAILED DESCRIPTION

One or more embodiments will be described below. These described embodiments are only examples of implementation techniques, as defined solely by the attached claims. Additionally, in an effort to provide a focused description, irrelevant features of an actual implementation may not be described in the specification.

Figure 1:
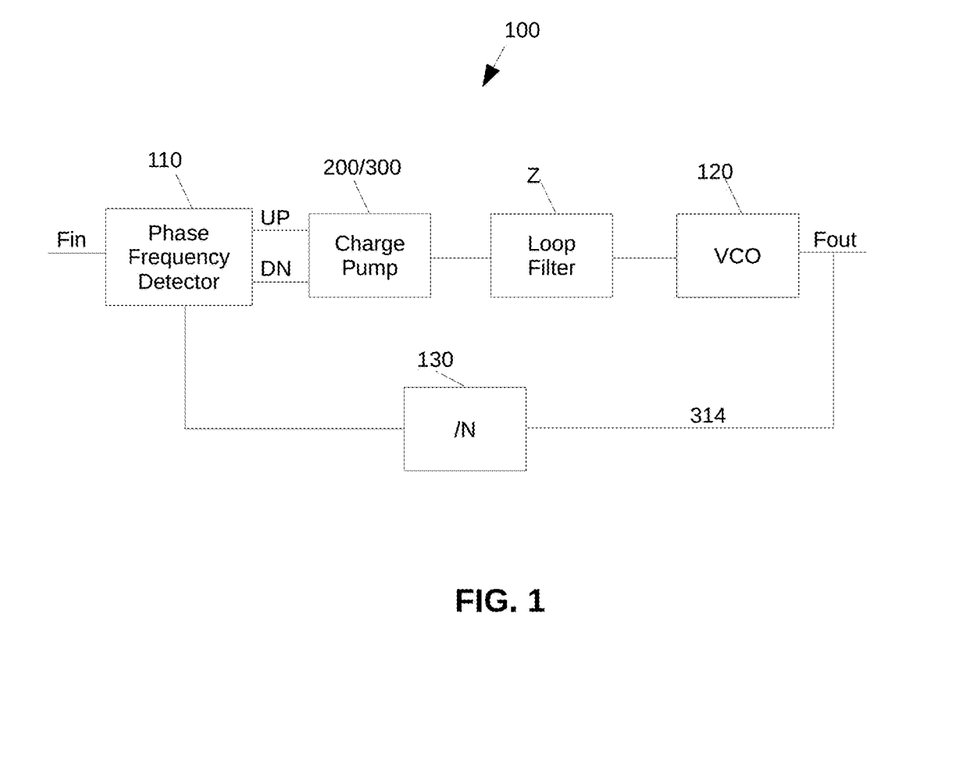
FIG. 1 is a block diagram of a phase locked loop.

With reference to FIG. 1, a phase locked loop 100 is now described. The phase locked loop 100 includes a phase frequency detector (PFD) 110, which receives an input signal Fin having an input frequency, and an output signal Fout having an output frequency. The output signal Fout received by the phase frequency detector 110 is the output signal Fout of the phase locked loop 100. The phase frequency detector 110 has outputs UP, DN coupled to a charge pump 200 or 300, also referred to as an attenuation circuit. The charge pump 200 or 300 in turn has an output coupled to a loop filter Z, which is in turn coupled to a voltage controlled oscillator (VCO) 120. The output of the VCO 120 is coupled to the input of the phase frequency detector 110 via an optional divider 130.

In operation, the phase frequency detector 110 compares the input signal Fin to the output signal Fout, and generates the control signals UP, DN for the charge pump 200 or 300 based thereupon. When the phase of the input signal Fin leads the phase of the output signal Fout, the control signal UP is asserted at a logic high, while the control signal DN remains at a logic low. Conversely, then when the phase is the input signal Fin lags the phase of the output signal Fout, the control signal DN is asserted at a logic high, while the control signal UP remains at a logic low. When the phase of the input signal Fin and the phase of the output signal Fout match, neither UP nor DN are asserted.

The charge pump 200 or 300 generates a control signal for the VCO 120, which is passed through the loop filter Z, which extracts the low frequency content of the control signal. The VCO 120, based on the control signal, adjusts the phase and frequency of the output signal Fout. When UP is asserted, the charge pump 200 or 300 increases the voltage of the control signal, as opposed to decreasing the voltage of the control signal when DN is asserted. Those of skill in the art will appreciate that since the phase of the input signal Fin cannot both lead and lag the phase of the output signal Fout, the phase frequency detector 110 will not simultaneously assert both UP and DN.

An optional divider 130 may be included in the feedback loop coupling the output signal Fout to the phase frequency detector 110. The divider 130 serves to divide the frequency of the output signal Fout, thereby causing the frequency of the output signal Fout to be generated by the VCO 120 as a multiple of the frequency of the input signal Fin. For example, if the divider 130 divides the frequency by 2, in order for the phase frequency detector 110 to see that the input signal Fin and the feedback signal (the output signal Fout after being fed through the divider 130) have a same frequency, the output signal Fout would have a frequency twice that of the input signal Fin. If the divider 130 is not present, or if the divider divides by 1, then the frequency of the output signal Fout will match the frequency of the input signal Fin.

Figure 2:
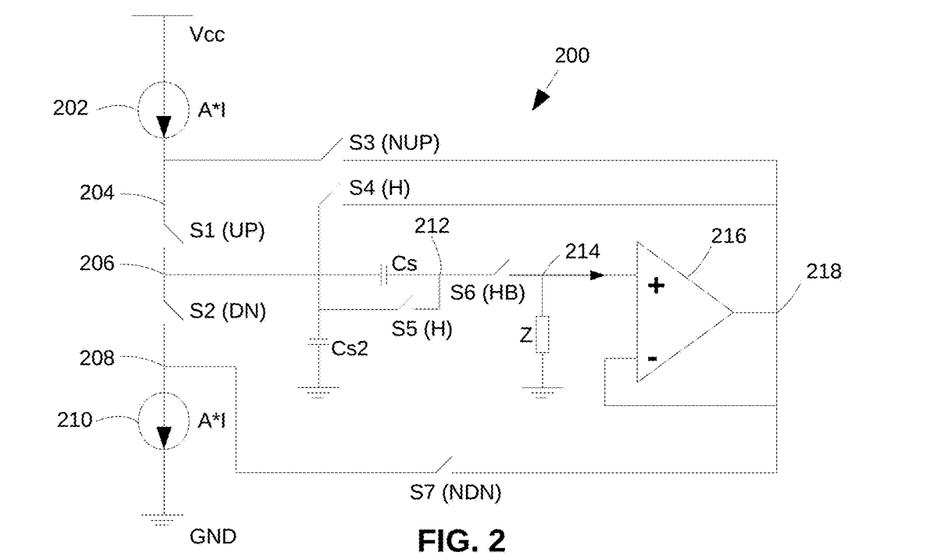
FIG. 2 is a schematic diagram of a charge pump circuit such as may be used in the phase locked loop of FIG. 1.

Details of the charge pump 200 and loop filter Z will now be given with reference to FIGS. 2-3. The charge pump 200 includes a first current source 202 coupled between a power supply node Vcc and a node 204. Switch S1 is coupled between node 204 and node 206. Switch S2 is coupled between node 206 and node 208. A second current source 210 is coupled between node 208 and ground. Switch S3 is coupled between node 204 and node 218. Switch S4 is coupled between node 206 and node 218. Switch S7 is coupled between node 218 and node 208.

A first capacitor Cs is coupled between node 206 and node 212, and switch S5 is coupled in parallel with the first capacitor Cs between node 206 and node 212. A second capacitor Cs2 is coupled between node 206 and ground GND. Switch S6 is coupled between nodes 212 and 214, and the loop filter Z is coupled between node 214 and ground. In addition, the non-inverting terminal of an amplifier 216 is coupled to node 214, while the inverting terminal and output terminal of the amplifier 216 is coupled to the node 218. The capacitors Cs and Cs2 have a capacitance value less than a capacitance value of impedance elements used in the loop filter Z. The value of Cs2 differs from that of Cs by a factor of one less than a desired gain A of the charge pump circuit 100. That is, the value of Cs2 is Cs*(A−1).

Figure 3:
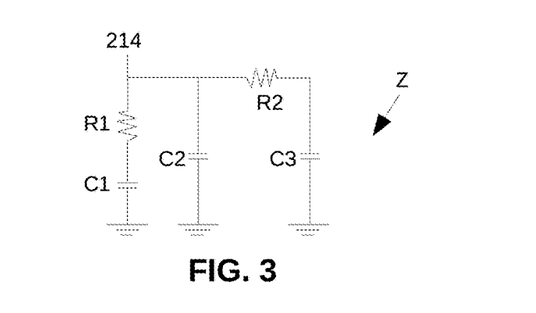
FIG. 3 is a schematic diagram of a loop filter such as may be used in the phase locked loops of FIGS. 1 and 4.

The loop filter Z, details of which are shown in FIG. 3, includes a resistor R1 and capacitor C1 coupled in series between node 214 and ground. A capacitor C2 is coupled between node 214 and ground, and a resistor R2 and capacitor C3 are coupled in series between node 214 and ground.

Figure 2A:
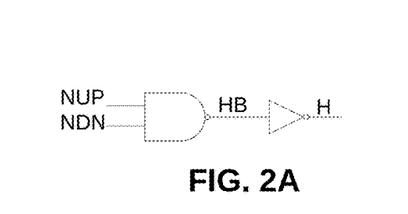
FIG. 2A is a block diagram of a circuit that may be used to generate the control signals H and HB for the charge pump circuit of FIG. 2.

In operation, switch S1 is triggered in response to assertion of UP, while switch S2 is triggered in response to assertion of DN. Switch S3 is triggered in response to assertion of a complement of UP, noted as NUP, while switch S7 is triggered in response to assertion of a complement of DN, noted as NDN. Switch S6 is triggered in response to assertion of a signal representing a logical NAND operation between the complement of UP and the complement of DN HB (shown in FIG. 2A), while switches S4 and S5 are triggered in response to assertion of a signal H which is a complement of that signal.

Thus, when the phase of the input signal Fin leads the phase of the output signal Fout, the phase frequency detector 110 asserts UP while keeping DN low. The switches S1, S6, and S7 are closed and the other switches opened, resulting in the flow of current from the first current source 202 through nodes 204 and 206 into the second capacitor Cs. This serves to charge up the second capacitor Cs with a voltage seen at node 214. The amplifier 216 has a unity gain, and thus passes the voltage seen at node 214 to its output at node 218. The control signal for the VCO 120 is output from node 214.

On the other hand, when the phase of the input signal Fin lags the phase of the output signal Fout, the phase frequency detector 110 asserts DN while keeping UP low. The switches S2, S3, and S6 are thus closed and the other switches opened, resulting in the sinking of current from node 206, and thus the discharge of the voltage at the second capacitor Cs. Therefore, the voltage at node 214 falls, which the amplifier 216 passes to its output at node 218. The control signal for the VCO 120 is output from node 214.

Where the phase of the input signal Fin is matched to the phase of the output signal Fout, the phase frequency detector 110 asserts neither UP nor DN. Thus, switches S3, S4, S5, and S7 close, while the other switches remain open. This serves to pass the current from the first current source 202 through the node 204, into node 218, into node 208, and to ground GND through the second current source 210.

Figure 6:
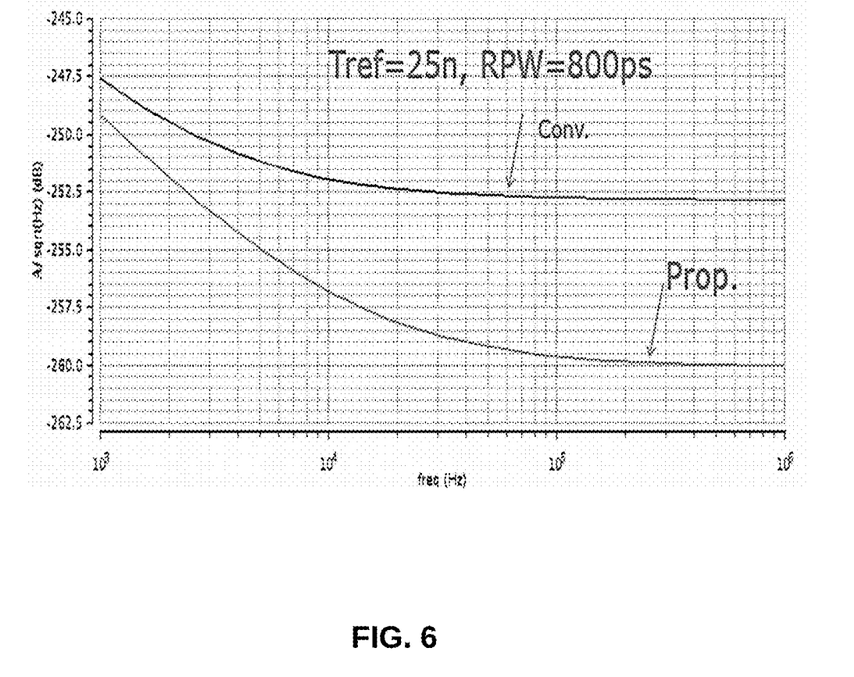
FIG. 6 is a graph showing output current noise for the charge pump circuits described herein vs. conventional charge pump circuits.
Figure 7:
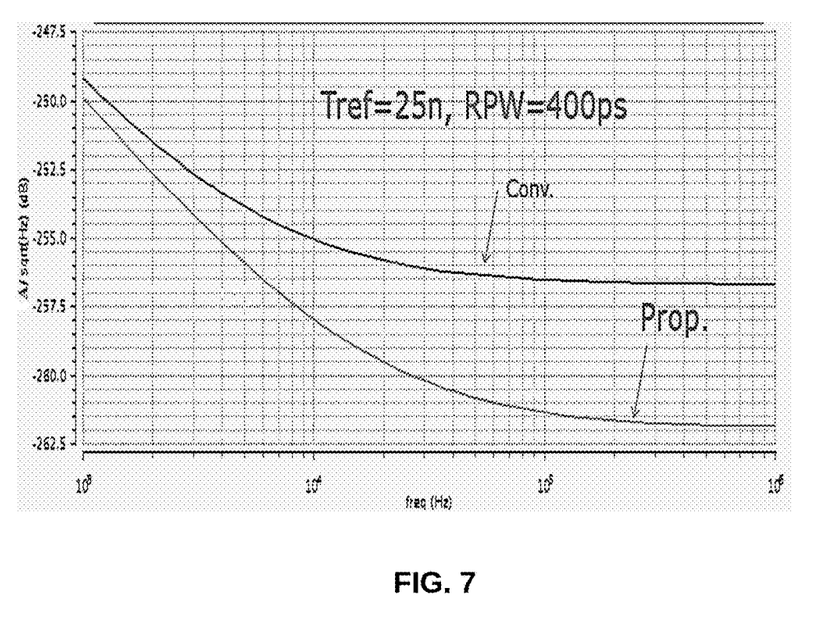
FIG. 7 is another graph showing output current noise for the charge pump circuits described herein vs. conventional charge pump circuits.

The charge pump circuit 200 described above provide a variety of advantages over traditional charge pump circuits. For example, the charge pump circuit 200 uses a charge-pump current 202 and 210 that is higher by a factor of A, but preserves the overall PLL loop gain by an attenuation factor of 1/A which is achieved via capacitive division. This is illustrated in FIGS. 6-7. Shown in FIGS. 8A-8C is how noise suppression increases as A increases. In addition, the thermal noise in the charge pump circuit 200 from the current sources 202 and 210 is reduced by a factor of A. Amplifier noise feedthrough to the loop filter Z is proportional to Cs*Vamp*Fin, where Fin is the input frequency to the PLL and where Vamp is the voltage at the non-inverting terminal of the amplifier 216, and should be less than the noise from the current sources 202 and 210. Thus, for the same loop gain in the charge pump circuit 200, the noise entering the loop filter Z is reduced. This also serves to reduce the in-band phase noise. The reduction in output noise over conventional charge pump circuits is on the order of 1/A and can be seen in FIGS. 6-7.

Figure 4:
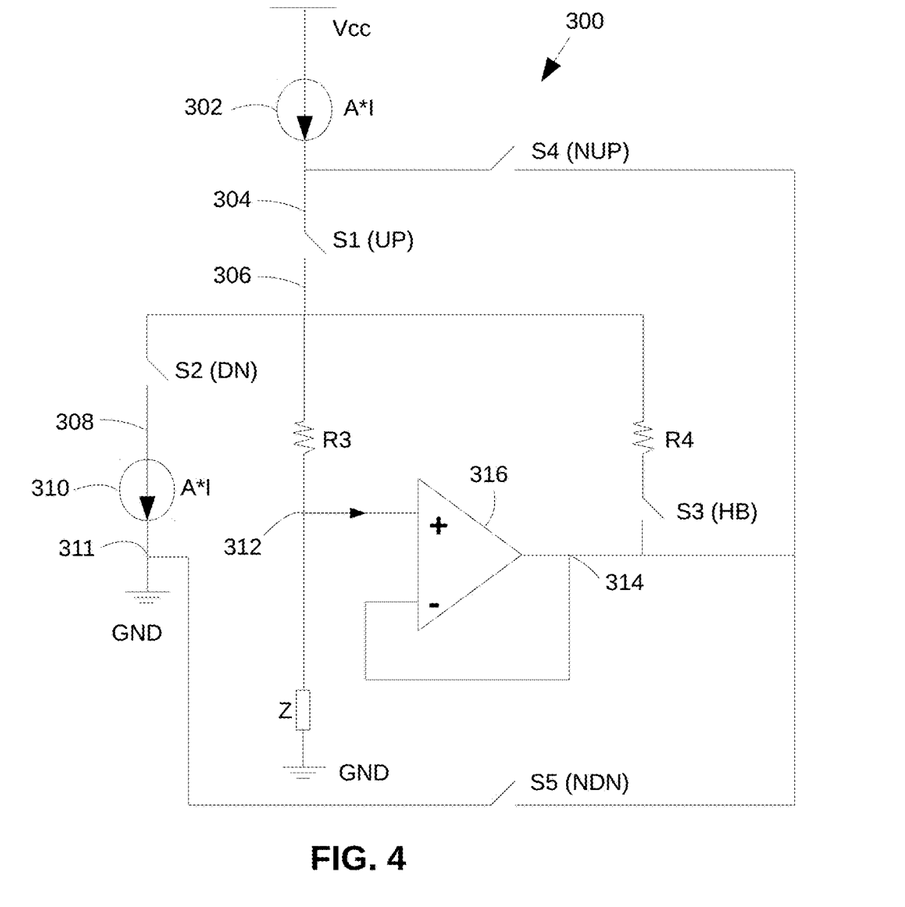
FIG. 4 is a schematic diagram of another charge pump circuit such as may be used in the phase locked loop of FIG. 1.

An alternate design for the charge pump circuit 300 is now described with reference to FIG. 4. The charge pump circuit 300 includes a first current source 302 coupled between the power supply node Vcc and node 304, and a switch S1 coupled between the node 304 and a node 306. A switch S2 is coupled between the node 306 and a node 308. A second current source 310 is coupled between the node 308 and ground GND. A resistor R3 is coupled between the node 306 and a node 312, and the loop filter Z is coupled between the node 312 and ground GND. A resistor R4 is coupled between the node 306 and a node 314, through switch S3. A amplifier 316 has its non-inverting terminal coupled to node 312, and its inverting terminal and its output coupled to the node 314. The values of the resistor of the attenuation filter Z is high. A switch S4 is coupled between node 304 and node 314. Node 314 is coupled to node 311.

The resistance of the resistor R3 may equal (A−1)*R4, while the resistance of R4 is chosen to reduce the noise contribution from the resistive attenuation network and make its noise contribution less than that of current sources 302 and 310. To do so, R4>A/Gm, where Gm is the transconductance of the current sources 302 and 310. This causes 1/A of the current from the current sources 302, 310 to flow across R3 and into the attenuation filter Z. The current sources 302, 310 conduct A times more current than conventional charge pump current sources, thus the transconductance of the current sources 302, 310 can be A times more than that of conventional charge pump current sources. In addition, when the resistors R3 and R4 have large values, the noise from the amplifier 316 that enters the attenuation filter Z is reduced.

In operation, switch S1 is triggered in response to assertion of UP, while switch S2 is triggered in response to assertion of DN. Switch S3 is triggered in response to assertion of a logical NAND operation between complements of UP and DN, denoted as HB, while switch S4 is triggered in response to a complement of assertion of UP and switch S5 is triggered in response to a complement of assertion of DN.

Therefore, when the phase of the input signal Fin leads the phase of the output signal Fout, the phase frequency detector 110 asserts UP while keeping DN low. Switch S1, S3, and S5 are then closed while switch S2 and S4 are open, resulting in the flow of current from the first current source 302 through node 306, into the resistor R3, and into node 312, thereby generating a voltage across the resistor R3, which is seen by the non-inverting terminal of the amplifier 316 at node 312, which passes the voltage at node 312 to its output at node 314. The control signal for the VCO 120 is output from node 312.

When the phase of the input signal Fin lags the phase of the output signal Fout, the phase frequency detector 110 asserts DN while keeping UP low. The switches S2, S3, and S4 close while the switches S1 and S5 open, resulting in the sinking of current from node 306. Therefore, the voltage at node 312, and thus the voltage of the control signal for the VCO 120, falls.

When the phase of the input signal Fin matches the phase of the output signal Fout, the phase frequency detector 110 asserts neither UP nor DN. Thus, switches S4, S5 are closed, while switches S1, S2, S3 remain open. This serves to couple output of the amplifier 316 to the non-inverting terminal of the amplifier 316 and to ground, lowering the voltage at node 312, and thus the voltage of the control signal for the VCO 120.

Figure 5:
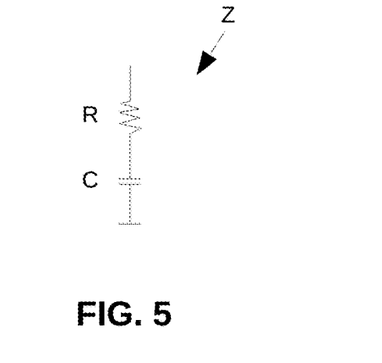
FIG. 5 is a schematic diagram of a loop filter such as may be used in the phase locked loop of FIG. 4.

The loop filter Z of FIG. 5 is usable with the charge pump circuit 300, and comprises a resistor R coupled in series with a capacitor C. When the loop filter Z is employed, the value of the resistor R3 differs from that of the resistor R4 by a factor of one less than a desired gain A of the charge pump circuit 300. That is, the value of R3 is R4*(A−1).

The charge pump circuit 300 has the same advantages as the charge pump circuit 200 described above. As stated, the charge pump circuit 300 offers an increased gain over conventional charge pumps by a factor of A, yet reduces the loop gain within the charge pump circuit 300 by a factor of 1/A, so the overall loop gain for the phase locked loop 100 is preserved. In addition, the thermal current noise in the charge pump circuit 300 is increased by a factor of A or $\sqrt{A}$, but is attenuated by $$\frac{1}{A^2}$$

when entering the loop filter Z. The noise feed through from the amplifier 316 to the loop filter Z is proportional to $$\frac{Vamp}{A*R4}.$$

Thus, for the same loop gain in the charge pump circuit 300, the noise entering the loop filter Z is reduced.

Figure 8:
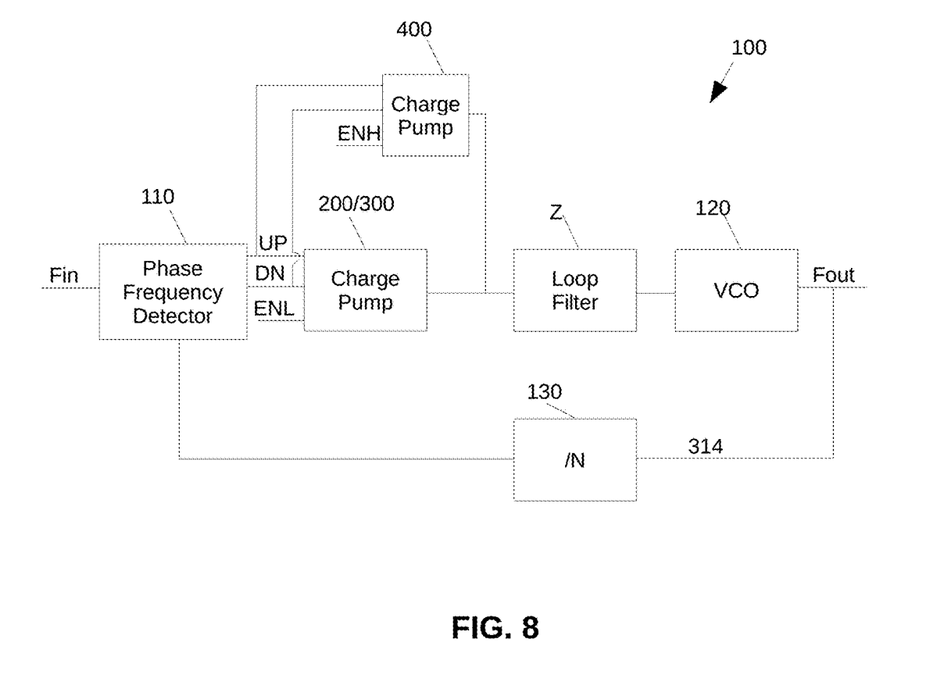
FIG. 8 is a schematic diagram of another phase locked loop such as may employ the charge pump circuits of FIGS. 2 and 4.

An embodiment where the phase locked loop 100 employs one of the charge pump circuits 200, 300 described above as well as an additional charge pump circuit 400 is now described with reference to FIG. 8. The phase locked loop 100 operates as the phase locked loop of FIG. 1, however the additional charge pump circuit 400 is coupled in series between the PFD 110 and the loop filter Z before the phase locked loop 100 locks, while one of the charge pump circuits 200, 300 is coupled in series between the PFD 110 and the loop filter Z after the phase locked loop 100 locks. The purpose of this selection between charge pump circuits 200, 300 or 400 is so as to assist quick locking of the phase locked loop 100 while still receiving the advantages of the charge pump circuits 200, 300 as described above. It should be noted that if the current output by the charge pump 400 is I, then the current output by the charge pump circuits 200, 300 would be I*A. Selection of the charge pump circuit 200, 300 or 400 is based upon a selection signal.

Figure 10:
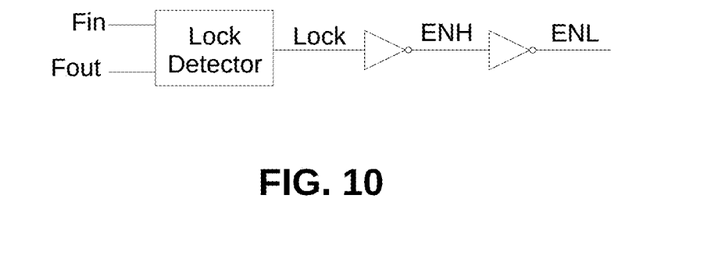
FIG. 10 is a block diagram of a logic circuit to generate the selection signal for the charge pump circuit of FIG. 9.

As shown in FIG. 10, a selection signal LOCK is generated based on a lock detector detecting whether or not the phase locked loop 100 has locked, by comparing the input frequency Fin to the feedback signal. An inverse of this selection signal ENH is used to enable the charge pump circuit 400, while an inverse of that signal ENL is used to enable the charge pump circuits 200, 300.

Figure 9:
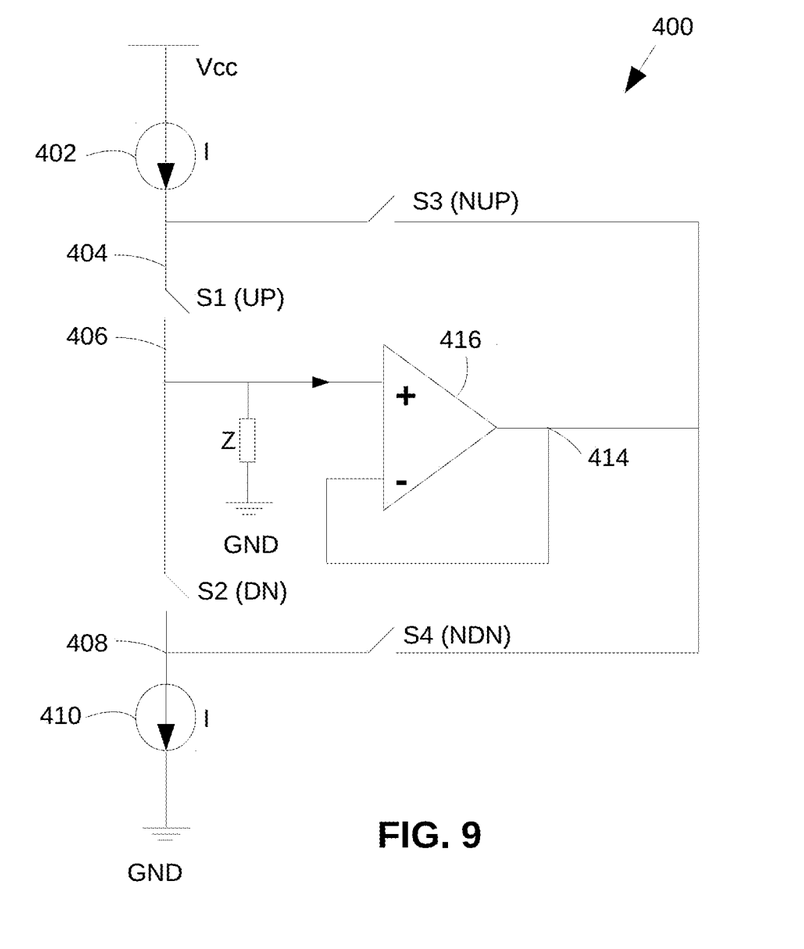
FIG. 9 is a schematic diagram of another charge pump circuit such as may be used in the phase locked loop of FIG. 8.

The charge pump circuit 400, as shown in FIG. 9, includes a first current source 402 coupled between a power supply node and node 404. A first switch S1 is coupled between node 404 and node 406. An amplifier 416 has a non-inverting terminal coupled to node 406. A loop filter Z is coupled between node 406 and ground. The inverting terminal of the amplifier 416 is coupled to its output at node 414 so as to bias the amplifier 416 in a unity gain mode.

A switch S2 is coupled between node 406 and node 408. A second current source 410 is coupled between node 408 and ground. A switch S3 is coupled between node 404 and node 414, while a switch S4 is coupled between node 414 and node 408. In operation, switch S1 is actuated by assertion of UP, while switch S2 is actuated by assertion of DN. Switch S3 is actuated by an inverse of UP, NUP, while switch S4 is actuated by an inverse of DN, NDN.

When the phase of the input signal Fin leads the phase of the output signal Fout, the phase frequency detector 110 asserts UP while keeping DN low. The switches S1, S4 are closed and the other switches opened, resulting in the flow of current from the first current source 402 through nodes 404 and 406 into the loop filter Z and the non-inverting terminal of the amplifier 416, thereby increasing the voltage seen at the non-inverting terminal. Due to the unity gain of the amplifier 416. The voltage seen at node 406 is passed to its output at node 414. The control signal for the VCO 120 is at node 406.

When the phase of the input signal Fin lags the phase of the output signal Fout, the phase frequency detector 110 asserts DN while keeping UP low. The switches S2, S3 are thus closed and the other switches opened, resulting in the sinking of current from node 406. Therefore, the voltage at node 406 falls, which the amplifier 416 passes to its output at node 414. The control signal for the VCO 120 is at node 406.

Where the phase of the input signal Fin is matched to the phase of the output signal Fout, the phase frequency detector 110 asserts neither UP nor DN. Thus, switches S3, S4 while the other switches remain open. This serves to pass the current from the first current source 402 through the node 404, into node 414, into node 408, and to ground GND through the second current source 410.

It should be understood that any of the loop filters Z described herein may be used with any of the embodiments described herein, and that other types of loop filters (i.e. active loop filters utilizing operational amplifiers) are also usable with any of the embodiments described herein.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
a phase frequency detector (PFD) configured to compare phases of an input signal and a feedback signal, and to generate first and second control signals as a function of that comparison;
a node;
a switching node; and
an attenuation circuit coupled to the node and the switching node, and comprising a capacitor coupled in series between the switching node and the node;
the attenuation circuit configured to
charge the capacitor and disconnect the switching node from ground based on assertion of the first control signal, and
discharge the capacitor and connect the switching node to ground based on assertion of the second control signal.

2. The circuit of claim 1, wherein assertion of the first control signal indicates a first relationship between the phase of the input signal and the phase of the feedback signal; and wherein assertion of the second control signal indicates a second relationship between the phase of the input signal and the phase of the feedback signal, the first and second relationships being mutually exclusive of one another.

3. The circuit of claim 2, wherein the first relationship indicates that the phase of the input signal leads the phase of the feedback signal; and wherein the second relationship indicates that the phase of the input signal lags the phase of the feedback signal.

4. The circuit of claim 1, further comprising an amplifier having a non-inverting terminal coupled to the node, an inverting terminal, and an output terminal coupled to the inverting terminal.

5. The circuit of claim 4, further comprising a voltage controlled oscillator (VCO) coupled to the output terminal of the amplifier and configured to generate an output signal based upon a voltage at the output terminal of the amplifier; and wherein the feedback signal is based upon the output signal.

6. The circuit of claim 1, wherein the attenuation circuit comprises a current sourcing circuit configured to charge the capacitor and a current sinking circuit configured to discharge the capacitor.

7. The circuit of claim 1, wherein the attenuation circuit comprises a first current source, a second current source, and a plurality of switches associated therewith; wherein the attenuation circuit charges the capacitor by coupling the first current source to the switching node using the plurality of switches such that the first current source sources current to the capacitor and disconnects the second current source from the switching node using the plurality of switches; and wherein the attenuation circuit discharges the capacitor by coupling the second current source to the switching node such that the second current source sinks current from the capacitor using the plurality of switches and disconnects the first current source from the switching node using the plurality of switches.

8. The circuit of claim 1, further comprising a loop filter coupled between the node and ground.

9. The circuit of claim 8, wherein the loop filter comprises a loop filter capacitor coupled between the node and ground; and wherein the capacitor has a capacitance less than a capacitance of the loop filter capacitor.

10. A circuit, comprising:
a phase frequency detector (PFD) configured to compare phases of an input signal and a feedback signal, and to generate first and second control signals as a function of that comparison; and
a charge pump circuit comprising:
a node;
a switching node; and
an attenuation circuit coupled in series between the switching node and the node, and comprising a resistor coupled to the node;
wherein the attenuation circuit is configured to source current to the switching node based on assertion of the first control signal, and to sink current from the switching node based on assertion of the second control signal.

11. The circuit of claim 10, wherein assertion of the first control signal indicates a first relationship between the phase of the input signal and the phase of the feedback signal; and wherein assertion of the second control signal indicates a second relationship between the phase of the input signal and the phase of the feedback signal, the first and second relationships being mutually exclusive of one another.

12. The circuit of claim 10, wherein the charge pump circuit further comprises an amplifier having a non-inverting terminal coupled to the node, an inverting terminal, and an output terminal coupled to the inverting terminal.

13. The circuit of claim 12, further comprising a voltage controlled oscillator (VCO) coupled to the output terminal of the amplifier and configured to generate an output signal based upon a voltage at the output terminal of the amplifier; wherein the feedback signal is based upon the output signal.

14. The circuit of claim 12, wherein the attenuation circuit comprises a first current source, a second current source, and a plurality of switches associated therewith; wherein the attenuation circuit sources current to the switching node by coupling the first current source to the switching node using the plurality of switches and disconnects the second current source from the switching node using the plurality of switches; wherein the attenuation circuit sinks current from the switching node by coupling the second current source to the switching node using the plurality of switches and disconnects the first current source from the switching node using the plurality of switches.

15. The circuit of claim 14, further comprising a feedback resistor coupled between the output terminal of the amplifier and the node.

16. The circuit of claim 15, wherein the feedback resistor has a resistance greater than a gain of the charge pump circuit divided by a transconductance of the first and second current sources.

17. The circuit of claim 16, wherein the resistor has a resistance equal to a product of the resistance of the feedback resistor and unity subtracted from the gain of the charge pump circuit.

18. A method, comprising:
comparing phases of an input signal to, and a feedback signal from, a phase locked loop and generating first and second control signals as a function of that comparison;
in response to assertion of the first control signal, charging a capacitor coupled in series between a switching node and a control node;
in response to assertion of the second control signal, discharging the capacitor;
buffering a voltage at the control node through to an output node; and
adjusting an output signal from a voltage controlled oscillator (VCO) as a function of the voltage at the output node;
wherein the feedback signal is based upon the output signal.

19. The method of claim 18, wherein assertion of the first control signal indicates a first relationship between the phase of the input signal and the phase of the feedback signal; and wherein assertion of the second control signal indicates a second relationship between the phase of the input signal and the phase of the feedback signal, the first and second relationships being mutually exclusive of one another.

20. The method of claim 18, wherein charging the capacitor comprises sourcing current to the switching node; and wherein discharging the capacitor comprises sinking current from the switching node.

21. A method, comprising:
comparing phases of an input signal to, and a feedback signal from, a phase locked loop and generating first and second control signals as a function of that comparison;
sourcing current to a resistor coupled in series between a switching node and a control node based on assertion of the first control signal;
sinking current from the resistor based on assertion of the second control signal;
buffering a voltage at the control node through to an output node; and
adjusting an output signal from a voltage controlled oscillator (VCO) as a function of the voltage at the output node;
wherein the feedback signal is based upon the output signal.

22. The method of claim 21, wherein assertion of the first control signal indicates a first relationship between the phase of the input signal and the phase of the feedback signal; and wherein assertion of the second control signal indicates a second relationship between the phase of the input signal and the phase of the feedback signal, the first and second relationships being mutually exclusive of one another.

* * * * *